(12) United States Patent
Won et al.

(10) Patent No.: US 9,513,649 B2
(45) Date of Patent: Dec. 6, 2016

(54) INTEGRATED CIRCUIT (IC), ADAPTIVE POWER SUPPLY USING IC CHARACTERISTICS AND ADAPTIVE POWER SUPPLY METHOD ACCORDING TO IC CHARACTERISTICS, ELECTRONIC DEVICE INCLUDING THE SAME AND MANUFACTURING METHOD OF IC

(71) Applicant: SAMSUNG ELECTRONICS CO., LTD., Suwson-si (KR)

(72) Inventors: Kang-young Won, Suwon-si (KR); Jae-hee Han, Yongin-si (KR); Tae-yong Son, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 122 days.

(21) Appl. No.: 13/711,876

(22) Filed: Dec. 12, 2012

(65) Prior Publication Data

US 2013/0169321 A1    Jul. 4, 2013

(30) Foreign Application Priority Data

Dec. 28, 2011 (KR) .......... 10-2011-0144958
Jan. 31, 2012  (KR) .......... 10-2012-0010061
Jul. 3, 2012   (KR) .......... 10-2012-0072167

(51) Int. Cl.
H03K 3/00    (2006.01)
G05F 1/66    (2006.01)
G01R 31/02   (2006.01)
G06F 1/32    (2006.01)

(52) U.S. Cl.
CPC .............. G05F 1/66 (2013.01); G01R 31/025 (2013.01); G06F 1/3203 (2013.01); G06F 1/324 (2013.01); G06F 1/3296 (2013.01); H03K 3/00 (2013.01); Y02B 60/1285 (2013.01)

(58) Field of Classification Search
USPC ......................................... 327/544
See application file for complete search history.

(56) References Cited

U.S. PATENT DOCUMENTS

| | | | |
|---|---|---|---|
| 6,704,880 B2 * | 3/2004 | Dai et al. ............ | 713/323 |
| 2003/0179028 A1 * | 9/2003 | Kizer et al. ............ | 327/158 |
| 2004/0103330 A1 * | 5/2004 | Bonnett ............ | G06F 1/3203 |
| | | | 713/322 |

(Continued)

FOREIGN PATENT DOCUMENTS

| | | |
|---|---|---|
| EP | 1 544 717 A2 | 6/2005 |
| EP | 2 296 276 A2 | 3/2011 |

OTHER PUBLICATIONS

Communication dated Jun. 10, 2016 issued by the European Patent Office in counterpart European Patent Application No. 12195555.3.

(Continued)

*Primary Examiner* — Lincoln Donovan
*Assistant Examiner* — Patrick Chen
(74) *Attorney, Agent, or Firm* — Sughrue Mion, PLLC

(57) ABSTRACT

Embodiments disclose an integrated circuit (IC) including a power input unit, which receives power from an external power supply, a core, which is driven by the power input through the power input unit, and a controller, which determines characteristics of the core and controls the external power supply to supply the power according to the determined characteristics.

7 Claims, 12 Drawing Sheets

(56) References Cited

U.S. PATENT DOCUMENTS

2005/0138444 A1\* 6/2005 Gaskins ........................ 713/300
2008/0104425 A1 5/2008 Gunther et al.
2011/0261493 A1 10/2011 Norman
2011/0264287 A1 10/2011 Yasuda et al.

OTHER PUBLICATIONS

Communication dated Sep. 20, 2016, issued by the European Patent Office in counterpart European Application No. 12195555.3.

\* cited by examiner

- PRIOR ART -

INTEGRATED CIRCUIT (IC), ADAPTIVE POWER SUPPLY USING IC CHARACTERISTICS AND ADAPTIVE POWER SUPPLY METHOD ACCORDING TO IC CHARACTERISTICS, ELECTRONIC DEVICE INCLUDING THE SAME AND MANUFACTURING METHOD OF IC

CROSS-REFERENCE TO RELATED APPLICATION

This application claims priority from Korean Patent Application No. 10-2012-0072167, filed on Jul. 3, 2012 in the Korean Intellectual Property Office, Korean Patent Application No. 10-2011-0144958, filed on Dec. 28, 2011 in the Korean Intellectual Property Office, and Korean Patent Application No. 10-2012-0010061, filed on Jan. 31, 2012 in the Korean Intellectual Property Office, the disclosure of which is incorporated herein by reference.

BACKGROUND

Field

Apparatuses and methods consistent with the exemplary embodiments relate to an integrated circuit (IC) which receives optimum power according to its characteristics, an adaptive power supply device and a power supply method which supplies optimum power to the IC, an electronic device including the adaptive power supply device to supply optimum power to the IC and a manufacturing method of the IC.

Description of the Related Art

As shown in FIG. 1, a related art integrated circuit (IC) receives fixed power only when it is guaranteed by its specifications. However, even IC chips which are in the specifications have an insufficient low VCC margin, excessively consume power, or generate excessive heat depending on their characteristics. Thus, a system which employs the IC chips should have an additional circuit or include other measures.

If the related art IC is changed to another IC, which is not the same as the related art IC, but has similar specifications, a power circuit is revised due to characteristic differences. In particular, if a user desires to change only an additional board by upgrading its functions, rather than changing a main board including a power supply device, the circuit of the power supply of the main board should be modified.

Further, distribution occurs in the related art IC, depending on wafers and processes. FIG. 2 illustrates a graph which shows distribution of semiconductor wafers and a specification range according to the distribution.

Power specifications are tightly controlled in consideration of distribution of wafers and processes which occur, due to characteristics of semiconductors. Accordingly, such tight power specifications cause loss of many chips during processes, leading to a yield reduction.

SUMMARY

Accordingly, one or more exemplary embodiments provide a power supply method which identifies characteristics of an integrated circuit used in a TV system and supplies adaptive optimum power to the IC according to such characteristics.

Another exemplary embodiment provides a power supply method which adaptively supplies power to supplement characteristics of an IC to thereby minimize entire power consumption and radiation of heat and ease power specifications of the IC and increase a manufacturing yield of the IC.

Still another exemplary embodiment provides an integrated circuit which applies to a system in which an IC is changed or to a system in which a module including the IC is changed to thereby adaptively change power and ensure compatibility in changing a module even if characteristics of the same IC is changed or an IC is changed to another IC having similar power specifications.

Yet another exemplary embodiment provides an IC, a manufacturing method of the IC, electronic device and a method for driving the IC which stores a characteristic index value according to IC characteristics and adaptively receives power according to such characteristics.

BRIEF DESCRIPTION OF THE DRAWINGS

The above and/or other aspects will become apparent and more readily appreciated from the following description of the exemplary embodiments, taken in conjunction with the accompanying drawings, in which.

DETAILED DESCRIPTION OF EXEMPLARY EMBODIMENTS

Figure 1:
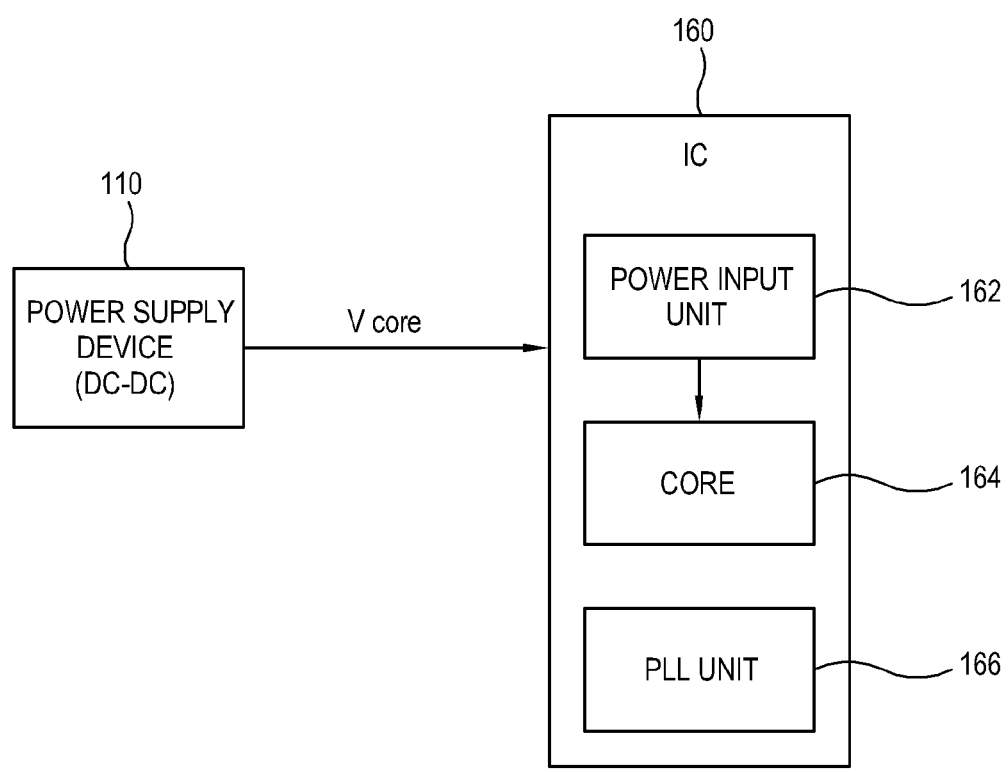
FIG. 1 is a block diagram of a power supply device of a related art integrated circuit (IC)

Below, exemplary embodiments will be described in detail with reference to accompanying drawings so as to be easily realized by a person having knowledge of one of ordinary skill in the art. The exemplary embodiments may be embodied in various forms without being limited to the exemplary embodiments set forth herein. Descriptions of well-known parts are omitted for clarity. Like reference numerals refer to like elements throughout.

Figure 3:
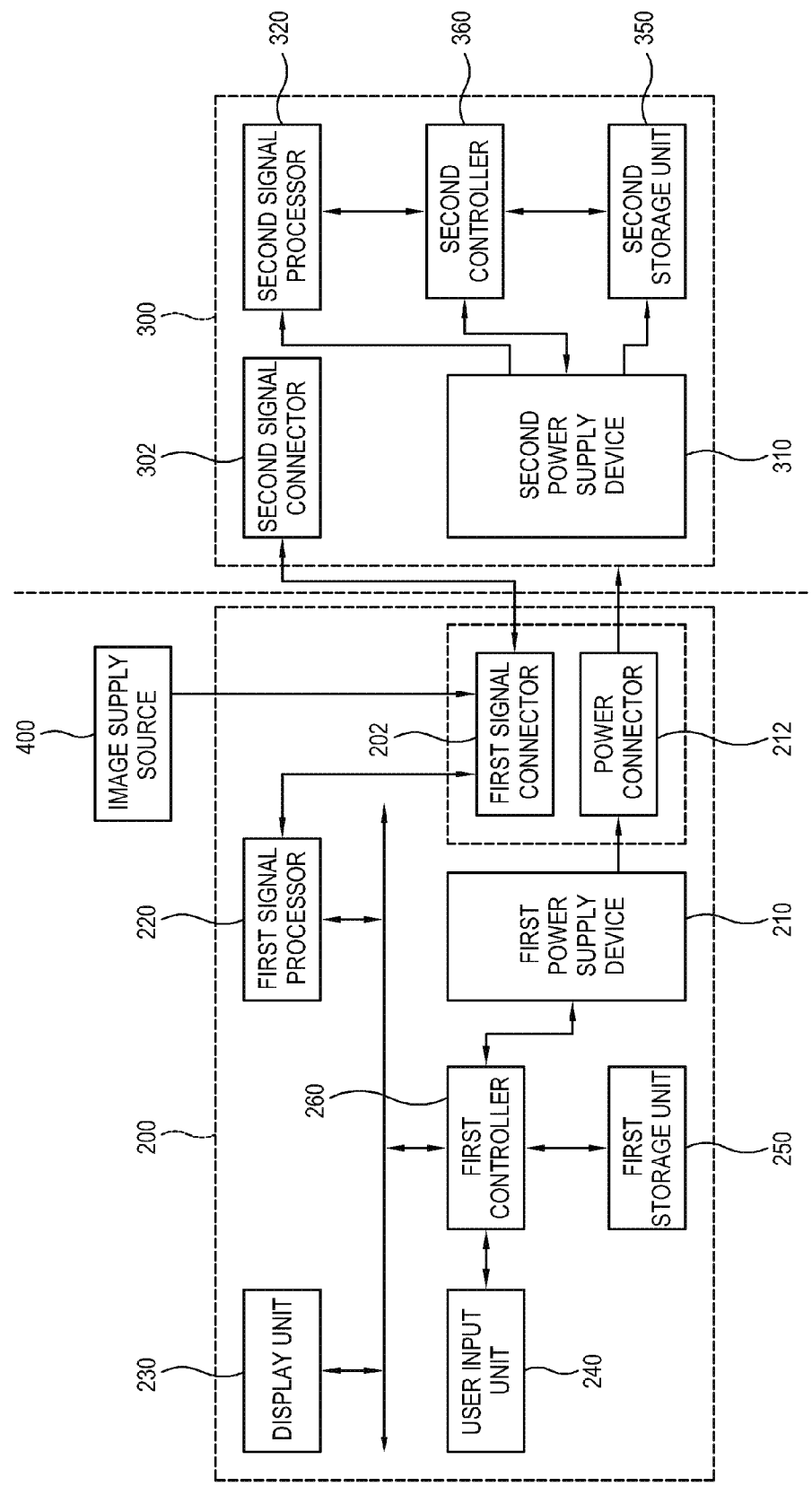
FIG. 3 is a block diagram of a display apparatus which may be upgraded for performance and functions.

FIG. 3 is a block diagram of a display system 1 of which hardware or software may be upgraded. The display system 1 is an example of an electronic device including an integrated circuit (IC) (not shown) and power supply devices 210 and 310.

As shown therein, the display system 1 includes a display apparatus 200, which processes an image signal supplied by an external image supply source, according to a signal processing operation, and which displays an image based on the processed image signal, and an upgrading apparatus 300, which upgrades hardware of the display apparatus 200.

In the display system 1 according to the present exemplary embodiment, the display apparatus 200 is implemented as a TV, which displays a broadcasting image based on broadcasting signals, broadcasting information, broadcasting data, transmitted by transmission equipment of a broadcasting station.

The type of an image which is displayable by the display apparatus 200 is not limited to the broadcasting image. The type of the image may include a video, still image, applications, on screen display (OSD), a graphic user interface (GUI) to control various operations, based on signals or data transmitted by external various image sources.

The upgrading apparatus 300 is connected to the display apparatus 200 for communication. The upgrading apparatus 300 upgrades existing hardware of the connected display apparatus 200, such that the upgraded hardware of the display apparatus 200 process an image signal and displays an image with improved quality.

The upgrading apparatus 300 may be connected to the display apparatus 200 in a wired or wireless manner. The upgrading apparatus 300 may be connected to the display apparatus 200 in a wired manner to exchange data, information, signals, or power with the display apparatus 200. The upgrading apparatus 300 and the display apparatus 200 include connectors or terminals (not shown) for mutual physical or electric connection.

The display apparatus 200 may solely process an image signal, which is transmitted from the outside, according to a signal processing operation, and display an image based on the processed image signal. However, the hardware or software of the display system 1, which performs the signal processing operation, is upgraded by the connection of the display apparatus 200 and the upgrading apparatus 300. Accordingly, an image with improved quality may be provided.

The display apparatus 200 includes a first signal connector 202, which is connected to at least one image supply source 400, a first signal processor 220, which processes an image signal transmitted by the image supply source 400 through the first signal connector 202, a display unit 230, which displays an image thereon based on the image signal processed by the first signal processor 220, a user input unit 240, which outputs a preset command according to a user's manipulation, a first storage unit 250, which stores therein unlimited data or information, at least one power connector 212 which is used to supply necessary power to the upgrading apparatus 300, and a first controller 260, which controls overall operations of the display apparatus 200.

The image signal, which is supplied by the at least one image supply source 400, is transmitted to the first signal processor 220 through the first signal connector 202.

The first signal processor 220 processes the image signal transmitted by the first signal connector 220, according to preset various signal processing operations. The first signal processor 220 outputs the processed image signal to the display unit 230 to display an image on the display unit 130 based on the image signal.

The display unit 230 displays an image thereon based on the image signal output by the first signal processor 220.

The user input unit 240 transmits preset various control commands or unlimited information to the first controller 260 according to a user's manipulation and input.

The first storage unit 250 stores therein unlimited data according to a control of the first controller 260.

The first controller 260 controls overall elements of the display apparatus 200. For example, the first controller 260 controls the first signal processor 220 to process an image, controls the first signal connector 202 to transmit and receive signals, information, or data and performs a control operation corresponding to a command input by the user input unit 240 to thereby control entire operations of the display apparatus 200.

The first power supply device 210 supplies power which is used by the display apparatus 200. For example, the first power supply device 210 generates a CPU core voltage to drive the first controller 260 and the first signal processor 220, a memory voltage to drive the first storage unit 250, an input or output voltage to drive the user input unit 240, a driving voltage to drive the display unit 230 and a speaker (not shown) and a voltage to drive other peripheral devices. The first power supply device 210 may include a switched-mode power supply (SMPS) or a DC-DC converter.

The first power supply device 210 according to the exemplary embodiment includes at least one power connector 212, which outputs a DC voltage to supply power to the upgrading apparatus 300.

According to the present exemplary embodiment, as the upgrading apparatus 300 which is provided to upgrade the display apparatus 200 is connected to the first signal connector 202, it upgrades at least one of existing hardware and software of the display apparatus 200.

The upgrading apparatus 300 includes a second signal connector 302 which is connected to the first signal connector 202 of the display apparatus 200, a second signal processor 320 which performs at least a part of the signal processing operation of the first signal processor 220, a second storage unit 350 which stores therein unlimited data or information, a second power supply device 510, which supplies power necessary for the upgrading operation of the upgrading apparatus 300, and a second controller 360, which controls overall operations of the upgrading apparatus 300.

The second power supply device 510 may include a regulator as a DC-DC converter, and is connected to the power connector 212 of the display apparatus 200 to output power necessary for the upgrading apparatus 300 and receives a DC voltage therefrom. The second power supply device 510 may use the DC voltage input by the display apparatus 200 to output a CPU core voltage to drive the second controller 360 and the second signal processor 320, a memory voltage to drive the second storage unit 350, and a voltage to drive other peripheral devices As shown in FIG. 3, the upgrading apparatus 300 does not include a display unit 130 or a speaker (not shown), which outputs video and audio, respectively. Thus, most of the power is used to drive the second controller 360 and the second signal processor 320 formed in the IC. If the upgrading apparatus 300 receives power from the first power supply device 210 of the display apparatus 200 through USB, USB 2.0 may receive DC 0.5V and USB 3.0 may receive DC 0.9V.

The upgrading apparatus 300 which is connected to the display apparatus 200 for upgrading the display apparatus 200, may be upgraded to higher specifications. As the entire replacement of the upgrading apparatus 300 is not cost-effective, only the second signal processor 320 and the second controller 360, as main components, may be upgraded. The existing second power supply device 510 or the second storage unit 350 may be maintained. If the second signal processor 320 and the second controller 360 are replaced, characteristics of the IC may be changed. Therefore, unnecessary heat, power consumption, or insufficient low voltage Vcc margin may occur.

Figure 4:
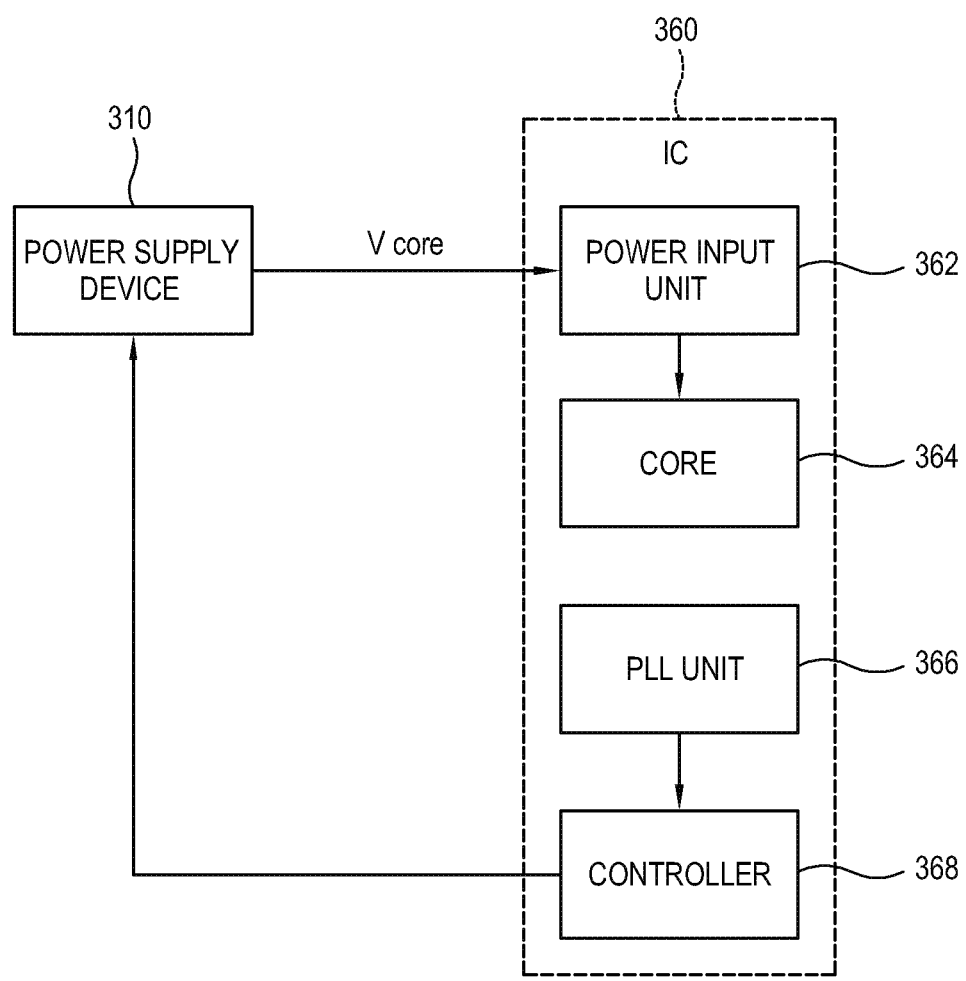
FIG. 4 is a block diagram of an IC according to an exemplary embodiment.

The display system 1 in FIG. 3 includes a number of ICs (not shown). The ICs may receive a core voltage through the first and second power supply devices 210 and 510. FIG. 4 is a block diagram of an IC 360, which may be used as the first controller 260 or the second controller 360 in FIG. 3. A power supply device 310, may be used as the first power supply device 210 and the second power supply device 310 in FIG. 3.

The power supply device 310 may include a DC-DC converter, and supplies a core voltage of approximately 1.1V to the IC 360.

The IC 360 may include a power input unit 362 which receives a core voltage from the power supply device 310, a core 364, a phase locked loop (PLL) unit 366, and a controller 368, which analyzes characteristics of the PLL unit 366. The IC 360 may be manufactured as a single chip, including the power input unit 362, the PLL unit 366, and the controller 368.

The power input unit 362 may receive a core voltage, e.g., DC 1.1 V from the power supply device 310, and transmit the core voltage to the core 364.

The core 364 may receive the core voltage and perform calculation and process data.

The PLL unit 366 is used to match an input signal and a base frequency, an output signal and a frequency, and may be used in a microprocessor to convert an internal clock frequency into a frequency multiplied by a positive number from an external clock frequency for faster clock frequency.

The controller 368 analyzes a PLL rising or falling slew rate of the PLL unit 364, which varies depending on ICs and system environment. The PLL rising or falling slew rate is a maximum value that an output voltage is changed with respect to an input, and may be used to determine the characteristics of the IC 360.

Figure 5:
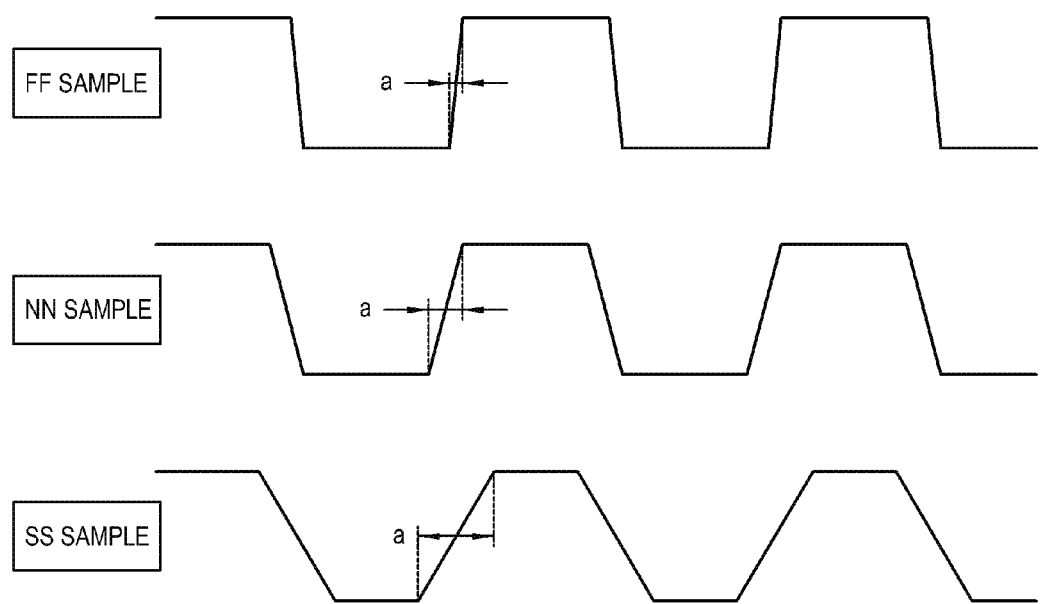
FIG. 5 illustrates an example of IC characteristics according to analysis of Phase Locked Loop (PLL) slew rate.

FIG. 5 illustrates samples which are determined according to the analysis of the PLL rising or falling slew rate with respect to the IC 360. In FIG. 5, the PLL rising or falling slew rate of the IC 360 may be analyzed. In other words, an FF sample shows a low PLL rising or falling slew rate, an SS sample shows a very high PLL rising or falling slew rate, and a NN sample corresponds to an intermediate PLL rising or falling slew rate of those of the FF and SS samples. If the PLL rising or falling slew rate is within a certain range according to preset standards, it may be determined to be a normal (NN) characteristic. If the PLL rising or falling slew rate is lower than the certain range according to preset standards, it may be determined to be a fast (FF) characteristic. If the PLL rising or falling slew rate exceeds the certain range according to preset standards, it may be determined to be a slow (SS) characteristic. Classification of the specifications as three phases of NN, FF and SS is an example. Thus, characteristics may be classified as other various phases.

The controller 368 generates a power control signal to the power supply device 310, according to the following characteristics of the IC 360.

In the case of the IC 360, of which the PLL rising or falling slew rate falls under the NN characteristic, base power supplied to the power input unit 362 is not changed. The base power means initial power guaranteed by the specifications of the IC 360.

In the case of the IC 360, of which the PLL rising or falling slew rate falls under the FF characteristic, power consumption increases and heat is radiated greatly due to a leakage current. Thus, power which is lower than the base power, is applied to the power input unit 362. Even if the lower power is applied, the range of the power may be within the specifications of the IC 360.

In the case of the IC 360, of which the PLL rising or falling slew rate falls under the SS characteristic, a low voltage Vcc margin is insufficient and power which is higher than the base power is applied to the power input unit 362. Therefore, even if the higher power is applied, the range of the power may be within the specifications of the IC 360.

Figure 6:
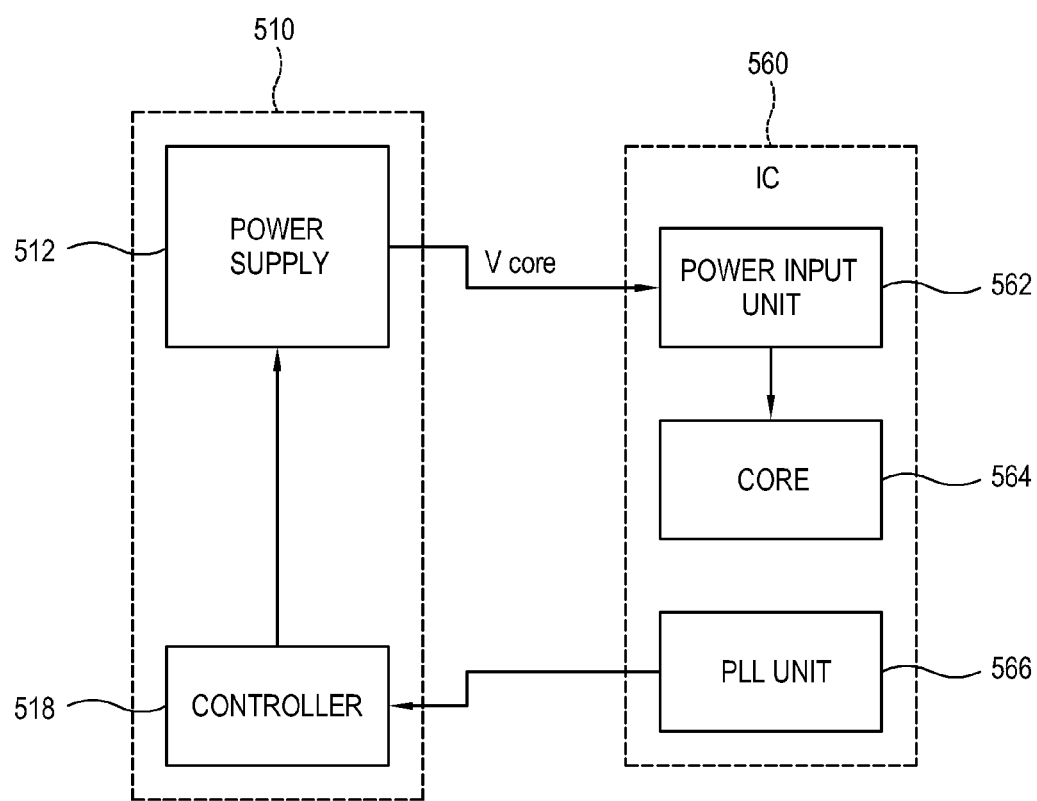
FIG. 6 is a block diagram of a power supply device of the IC according to the exemplary embodiment.

FIG. 6 illustrates a power supply device 510 according to another exemplary embodiment. As shown therein, the power supply device 510 may include a power supply 512 and a controller 518. Unlike the controller manufactured as a single chip in the IC 360 in FIG. 4, the controller 518 is included in the power supply device 510. In addition to the controller 518 of the power supply device 510, the controller 568 may be included in the IC 560. The controller 518 is connected to the PLL unit 566 of the IC 560 and analyzes the PLL rising or falling slew rate of the IC 560 and controls the power supply 512. In this case, the IC 560 is not needed to be additionally manufactured, and the controller 518 may apply to all manufactured ICs. Functions of the controller 518 are the same as those of the controller 568 of the IC 560 in FIG. 4. Thus, description will be omitted.

Figure 7:
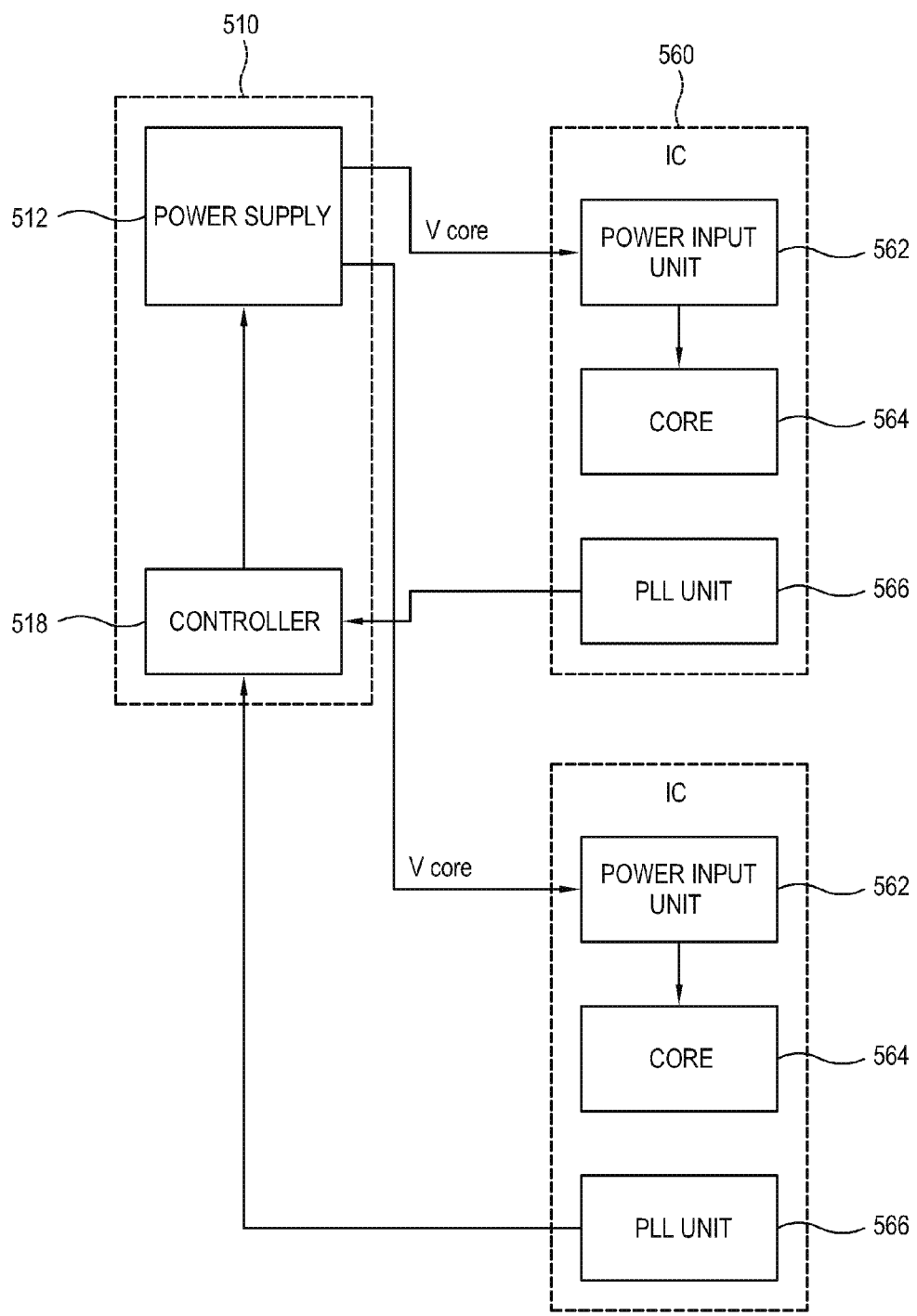
FIG. 7 is a block diagram of a power supply device of an IC according to another exemplary embodiment.

FIG. 7 illustrates a power supply device 510 according to another exemplary embodiment.

As shown in FIG. 3, an electronic device, such as the display system 1, may use a number of ICs 560. For example, an MPU of the first and second signal processors 220 and 320, a CPU of the first and second controllers 260 and 360, an I/O controller of the user input unit 240, and a communication controller of the first and second signal connectors 202 and 302 may be used.

As shown in FIG. 7, the controller 518 of the power supply device 510 may analyze the PLL rising or falling slew rate of the PLL unit 566 of the plurality of ICs 560, and allow the power supply 513 to supply optimum power to the ICs 560.

As optimum power is supplied to all ICs of the display system 1, power consumption and heat radiation may be minimized and a stable low voltage Vcc margin of the IC may be guaranteed.

As shown in FIGS. 4 to 7, rather than analyzing the PLL rising or falling slew rate of the PLL unit 566 of the IC 560 to control the power supply device 510, a transistor leakage current of the core 564 may be measured at the time of manufacturing the IC 560, and the characteristics of the IC 560 may be classified according to the size of the leakage current to control the power supply device 510.

Figure 8:
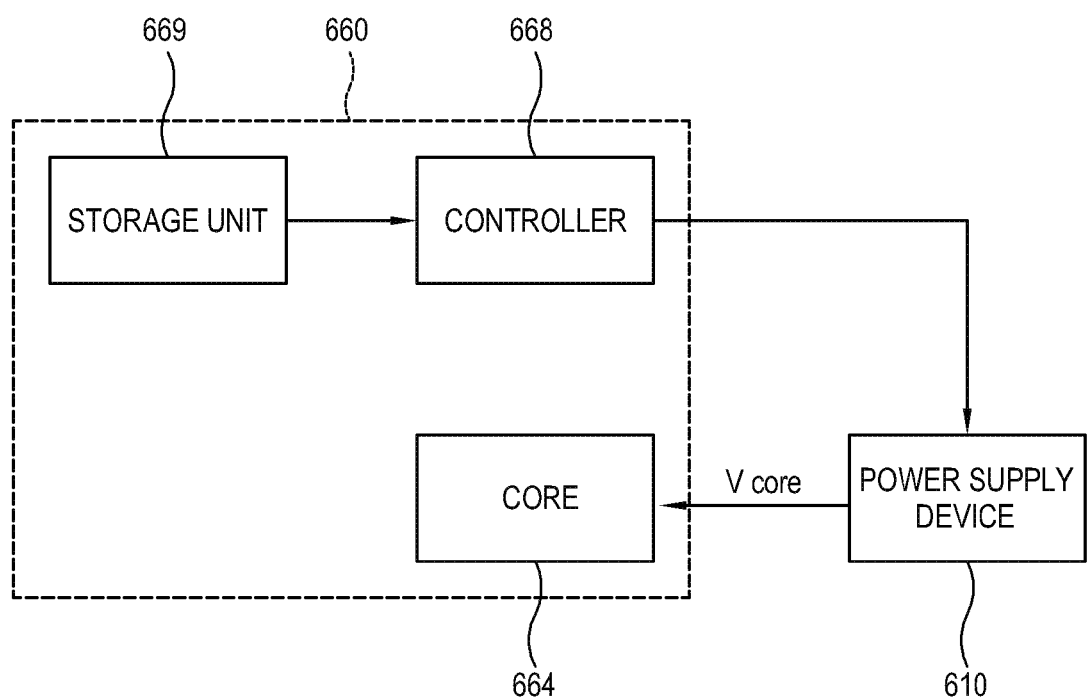
FIG. 8 is a block diagram of an IC according to another exemplary embodiment.

FIG. 8 illustrates an IC 660 and a power supply 610 according to another exemplary embodiment.

The IC 660 stores inherent information, including a characteristic index value indicating characteristics, in a storage unit 669. The characteristic index value may include an index value that is classified according to the size of the leakage current measurement of transistors in the core 664 included in the IC 660.

For example, the IC 660 may include a characteristic index value indicating a first group if a leakage current value measured from at least one of transistors forming the core 664 is in the first range, a characteristic index value indicating a second group if in a second range, and a characteristic index value indicating a third group if in a third range.

The characteristic index value may be included in inherent information, which means an identification (the "chip ID") for identifying information on process lot number, wafer number, and location on the wafer in the IC. In other words, the characteristic index value may be inserted into the chip ID and stored in the IC 660.

The power supply device 610 may supply power to the IC corresponding to the characteristic index value of the IC 660.

The power supply device 610 converts external power into driving power necessary for driving the IC 660, i.e., a core voltage, and supplies the core voltage to the IC 660. The power supply 610 may adaptively change and supply the core voltage according to the characteristic index value of the IC 660.

More specifically, if the characteristic index value of the IC 660 indicates the first group, the power supply 610 supplies the core voltage corresponding to the first group to the IC 660. If the characteristic index value of the IC 660 indicates the second group, the power supply 610 supplies the core voltage corresponding to the second group to the IC 660. If the characteristic index value of the IC 660 indicates the third group, the power supply 610 supplies the core voltage corresponding to the third group to the IC 660.

As above, the power supply device 610 may supply different core voltages to the IC 660, depending on the characteristic index value of the IC 660. Thus, the IC 660 may consume less power and be guided to perform a stable operation.

Figure 2:
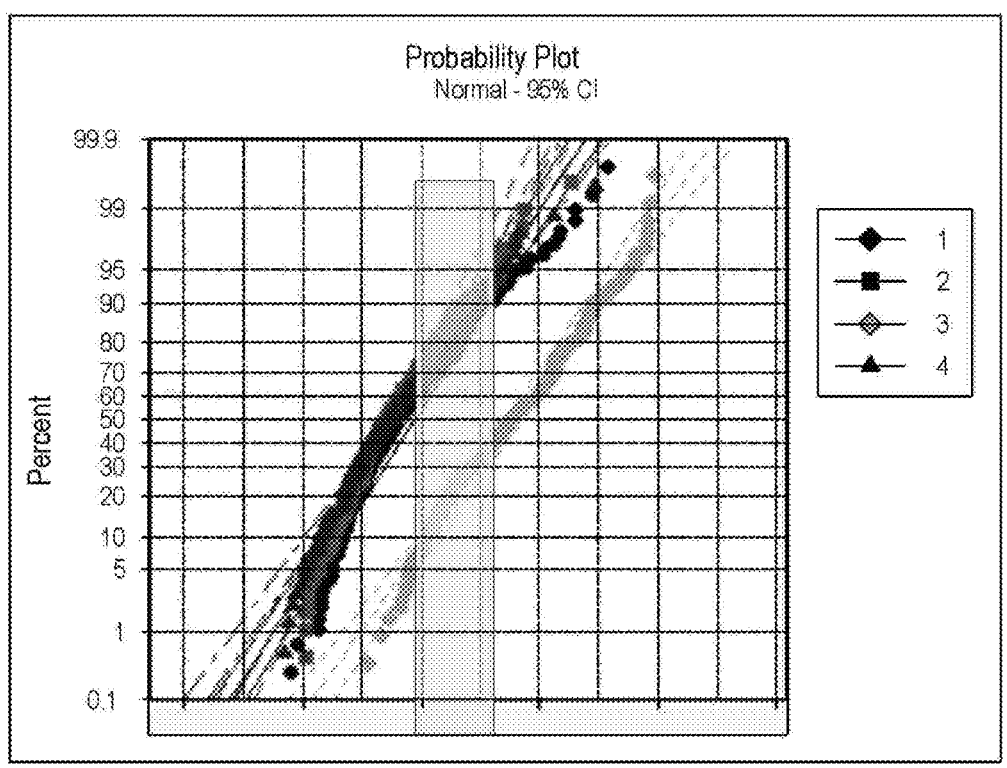
FIG. 2 is a graph which shows distribution of wafers of the IC and specification ranges, according to such distribution.

FIG. 8 is a block diagram which explains specific configurations of the IC 660 according to the exemplary embodiment. As shown therein, the IC 660 includes a storage unit 669, a controller 668, and a core 664. For purposes of convenience, the power supply device 610 is also shown in FIG. 2.

The storage unit 669 stores therein inherent information of the IC. More specifically, the storage unit 669 stores therein inherent information including a characteristic index value indicating characteristics of the IC 660. The characteristic index value means an index value that is classified by a size of a leakage current measurement of transistors in the core 664, and may be inserted into the inherent information and stored in the storage unit 669 in the IC 660.

Generally, the core includes a metal oxide semiconductor field effect transistor (MOSFET). The MOSFET has a large leakage current Ids between drain-source if the switching speed is fast, and a small leakage current therebetween if the switching speed is slow. By using such characteristics, a leakage current of at least one of transistors forming the core is measured at the time of manufacturing the IC and the characteristic index value is stored according to its range in which the measured leakage current value is included.

For example, if a leakage current of the transistor is 10 to 30 mA, a characteristic index value indicating a first group may be stored. If a leakage current of the transistor is 30 to 50 mA, a characteristic index value indicating a second group may be stored. If a leakage current of the transistor is 50 to 70 mA, a characteristic index value indicating a third group may be stored.

The range of the leakage current which is a basis for classifying the inserted characteristic index value may be decided by the size of the core voltage driving the IC, and a clock frequency.

More specifically, even ICs which have been manufactured to meet specifications desired by a user may have different characteristics due to distribution during a semiconductor process. In particular, ICs which exist in the corner of a wafer may have a larger or smaller leakage current value between drain-source than the ICs meeting the specifications. The ICs which have large leakage current consume more current, radiate a lot of heat, and consume more power. However, the ICs, which have large leakage current, may operate in a high clock frequency even when receiving a lower core voltage. Conversely, ICs which have a small leakage current operate in a high clock frequency when receiving a high core voltage, but do not radiate much heat nor consume much power, even when receiving a high core voltage.

According to present embodiments, such characteristics may be used to classify ICs into different groups.

First, ICs which have specifications, as desired by a user, are classified as one group. For example, it is assumed that ICs having a desired specification operate in 1 GHz, when receiving a core voltage of 1V. If the leakage current value measured from the ICs operating in 1 GHz, when receiving the core voltage of 1V, is within 30 to 50 mA, the same index value may be inserted into the ICs having the leakage current value in the foregoing range to classify them as one group.

ICs which have a larger or smaller leakage current value than the ICs having the desired specification, are classified as another group. For example, if the leakage current value measured from the ICs, which should receive a core voltage of 1.1V to operate in 1 GHz, is within 10 to 30 mA, the same index value is inserted into the ICs having the leakage current value in the foregoing range to classify them as another group. If the leakage current value measured from the ICs, which should receive a core voltage of 0.9V to operate in 1 GHz, is within 30 to 50 mA, the same index value is inserted into the ICs having the leakage current value in the foregoing range to classify them as another group.

According to present embodiments, the leakage current value of the ICs may be used to insert the characteristic index value into the ICs to classify the ICs.

The controller 668 may control the power supply 610 to supply power corresponding to the characteristic index value in the inherent information. More specifically, the controller 668 may read the characteristic index value in the inherent information stored in the storage unit 669 and control the power supply device 610 to supply a core voltage corresponding to the read characteristic index value to the core 664. Therefore, the storage unit 669 may store therein information on the core voltage corresponding to the characteristic index value.

As described above, it is assumed that the ICs have been classified into first to third groups according to the leakage current value. More specifically, the first group is assumed to be ICs which should receive a core voltage of 1.1V to operate in 1 GHz, the second group is assumed to be ICs which should receive a core voltage of 1V to operate in 1 GHz, and the third group is assumed to be ICs which should receive a core voltage of 0.9V to operate in 1 GHz.

In this case, if the characteristic index value which is read from the storage unit 669 is an index value indicating the first group, the controller 668 may control the power supply 610 to supply a core voltage of 1.1V. If the characteristic index value, which is read from the storage unit 669, is an index value indicating the second group, the controller 668 may control the power supply 610 to supply a core voltage of 1V. If the characteristic index value, which is read from the storage unit 669, is an index value indicating the third group, the controller 668 may control the power supply 610 to supply a core voltage of 0.9V.

Thus, the controller 668 may supply a core voltage according to characteristics of the ICs. Even ICs which have different characteristics, due to distribution during semiconductor processes, may receive a corresponding core voltage, resulting in a stable operation and reduction in power consumption.

The core 664 may perform calculation or process data and control operations of the IC 660. In the present exemplary embodiment, the IC 660 includes a single core 664. However, the present exemplary embodiments is an example, and the IC 660 may include two or more cores depending on its performance.

The power supply device 610 supplies a core voltage to the core 664, to drive the core 664 according to a control of the controller 668.

More specifically, the power supply device 610 converts AC power, which is supplied by an external power supply (not shown), into DC power. The power supply device 610 may convert the DC power into a core voltage corresponding to the characteristic index value stored in the storage unit 669 by using a DC-DC converter. The power supply device 610 may also supply the core voltage to the core 664. In other words, the power supply device 610 may adaptively convert the DC power into a core voltage, corresponding to the characteristic index value, according to a control of the controller 68 and supply the core voltage to the core 664.

Figure 9:
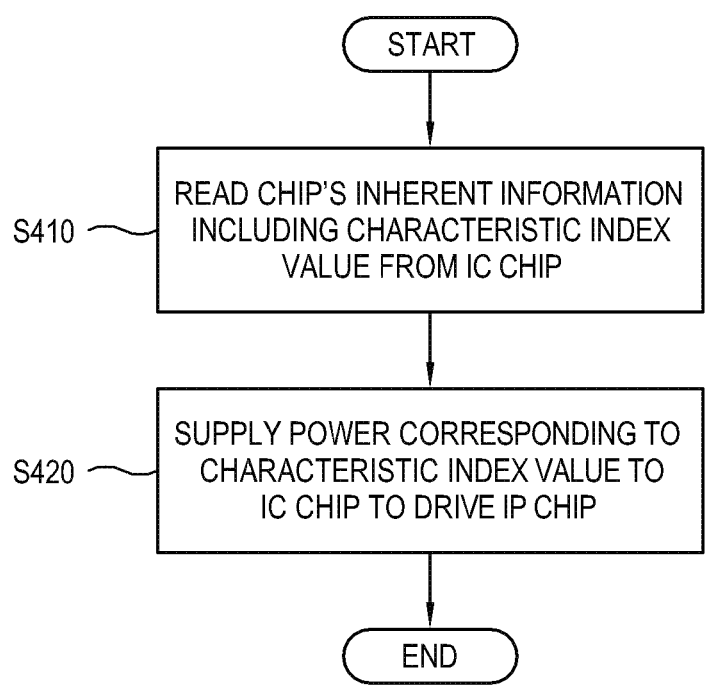
FIG. 9 is a flowchart showing a power supply method of the IC.

FIG. 9 is a flowchart showing a method of driving the IC according to the exemplary embodiment.

If the IC, which stores therein inherent information including the characteristic index value is installed in an electronic device, the inherent information stored in the storage unit 669 is read (S410). The characteristic index value may include an index value, that is classified by the size of the leakage current value of the core in the IC.

Power which corresponds to the characteristic index value included in the inherent information is supplied to, and drives, the IC (S420). More specifically, the core voltage corresponding to the characteristic index value is supplied to the core 664 of the IC to drive the IC 660.

Figure 10:
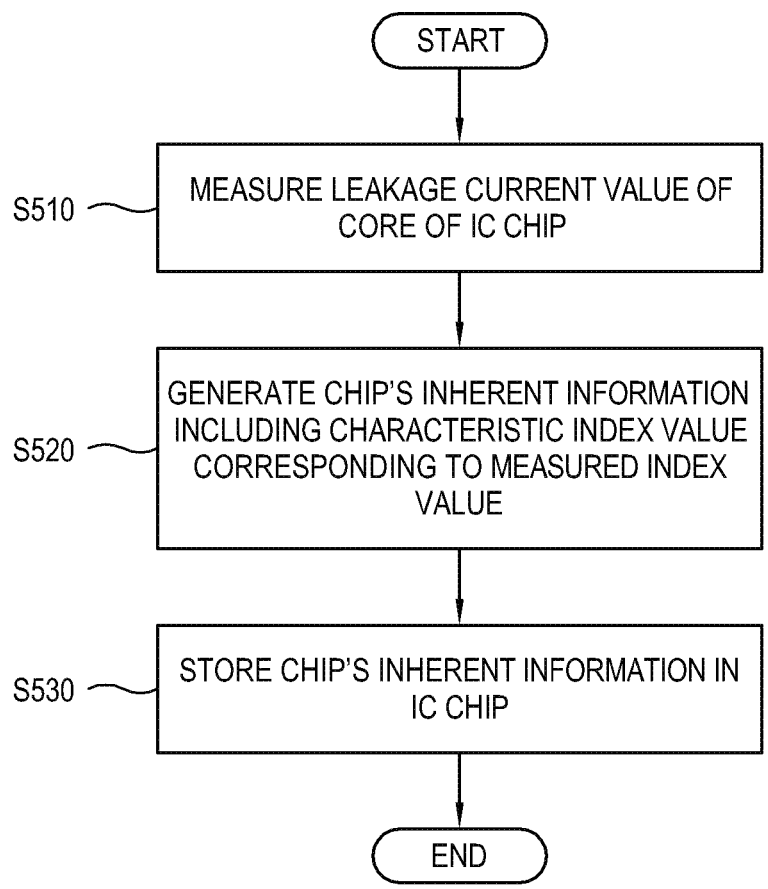
FIG. 10 is a flowchart showing a manufacturing method of the IC.

FIG. 10 is a flowchart explaining a manufacturing method of an IC, which may be installed in the electronic device for use according to the exemplary embodiment.

First, the leakage current value of the core of the IC is measured (S510). More specifically, the leakage current value between the drain-source of transistors forming the core is measured.

The chip's inherent information, including the characteristic index value corresponding to the measured leakage current value, is generated (S520). The chip's inherent information is stored in the IC (S530).

More specifically, depending on the range in which the measured leakage current value is included, different characteristic index values are inserted into the chip's inherent information.

For example, if the measured leakage current value belongs to the first range, the index value indicating the first group may be inserted into the chip's inherent information and stored in the IC. If the measured leakage current value belongs to the second range, the index value indicating the second group may be inserted into the chip's inherent information and stored in the IC. If the measured leakage current value belongs to the third range, the index value indicating the third group may be inserted into the chip's inherent information and stored in the IC.

The chip's inherent information means identification (hereinafter, "chip ID") for identifying information on process lot number, wafer number, and location on the wafer of the chip. In other words, the characteristic index value may be inserted into the chip ID and stored in the IC.

Programs which are used to implement methods according to various exemplary embodiment may be stored in various types of record media for use.

More specifically, codes which are used to implement the foregoing methods may be stored in various types of record media which are readable by a terminal, i.e., a random access memory (RAM), a flash memory, a read only memory (ROM), an erasable programmable ROM (EPROM), electronically erasable and programmable ROM (EEPROM), a register, a hard disc drive, a removable disc drive, a memory card, a USB memory stick, and a CD-ROM.

Figure 11:
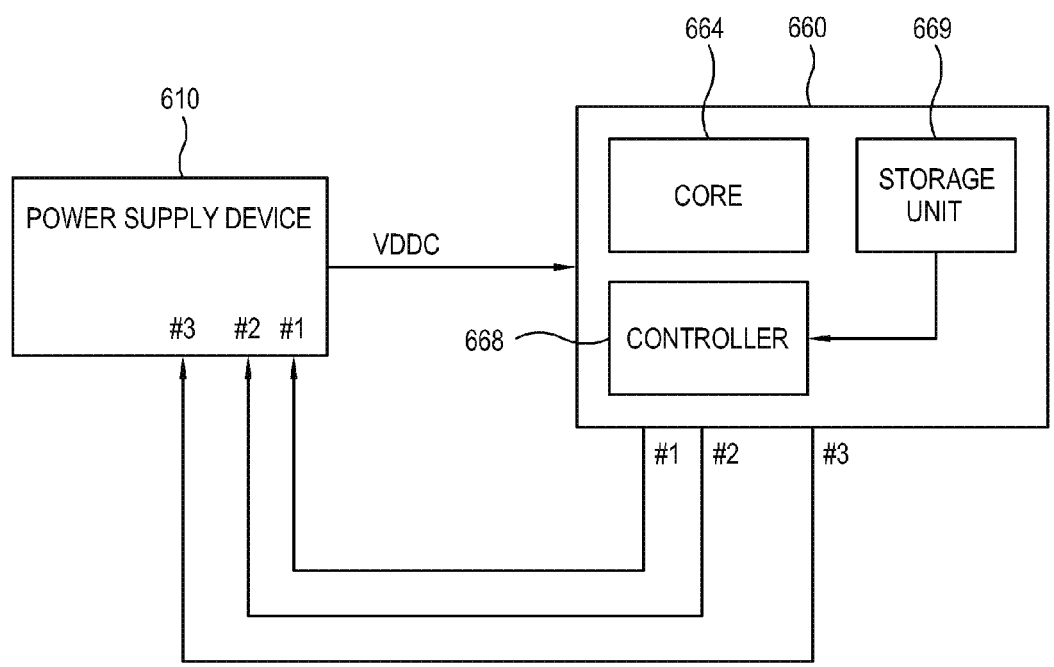
FIG. 11 is a block diagram explaining a power supply method of an IC according to another exemplary embodiment.

FIG. 11 illustrates an output port which is used to control the power supply device 610 in the IC 660.

Different characteristic data of the IC 660, e.g., FF, FS, SF, and SS are a basis for an output of output ports #1 and #2. Through such output, the power supply device 610, which supplies power to the IC 660, may be controlled.

Values according to characteristics of the IC 660 outputting through the output ports, and corresponding core voltage VDDC applied to the IC, may be set as in Table 1 below.

TABLE 1

| #1 | #2 | VDDC |
|---|---|---|
| L(0) | L(0) | 1.05 V |
| L(0) | H(1) | 1.10 V |
| H(1) | L(0) | 1.15 V |
| H(1) | H(1) | 1.20 V |

If the output port #1 is not an outcome of a normal internal process, an inaccurate core voltage VDDC may be supplied. In this case, the IC 660 may not operate, or may not operate until the characteristics are not checked completed after power supply.

Figure 12:
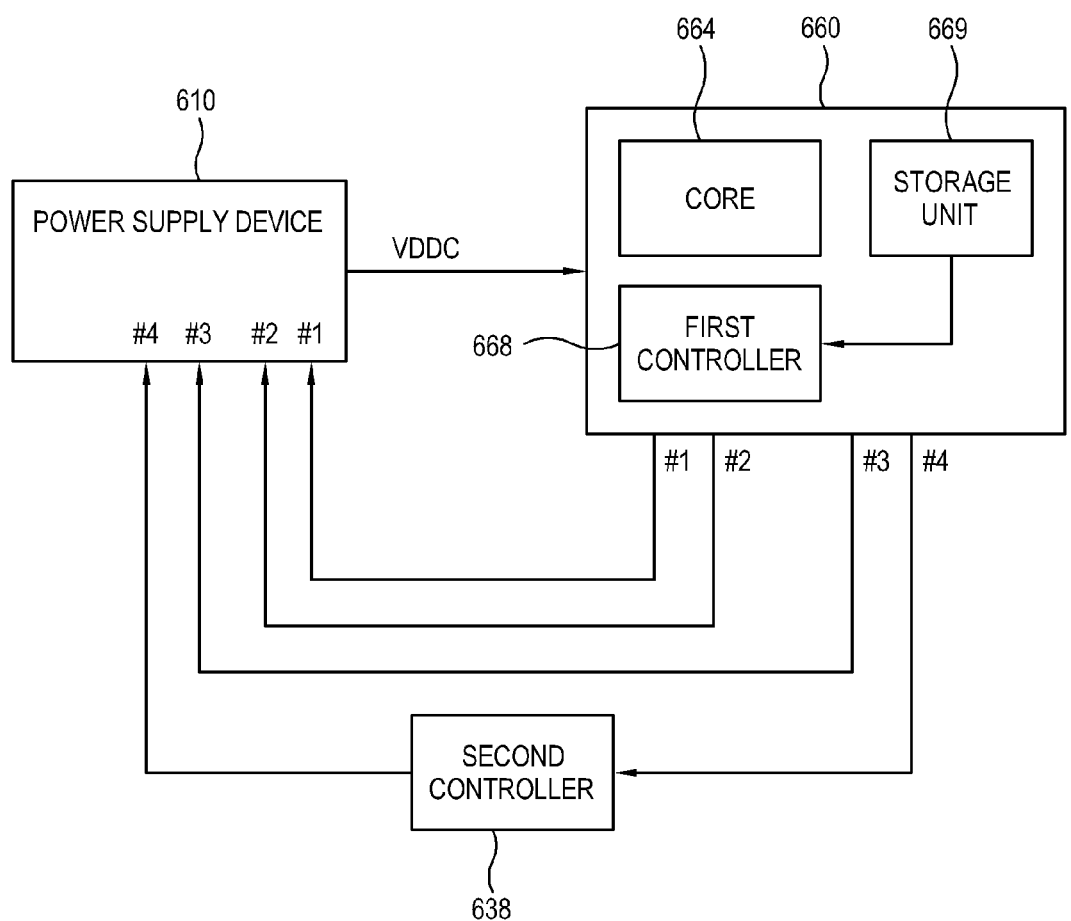
FIG. 12 is a block diagram explaining a power supply method of an IC according to another exemplary embodiment.

To solve the foregoing problem, output ports #3 and #4 which indicate the state of the IC 660, may be added as in FIG. 12.

If the internal operation is not normal, the output port #3 outputs "L or 0", and in such a state, the power supply device 610 outputs only a preset standard voltage Vref.

After the IC 660 is restarted and the internal process is confirmed to be normal, the output port #3 outputs "H or 1" and the output ports #1 and #2 output a self-examination result.

If the internal operation is not normal, the output port #4 continues to output "L or 0" or "H or 1". If the internal operation is in the normal state, the output #4 repeatedly outputs "H→L→H". For example, the second controller 638, such as a microcomputer checks the output state of the output port #4, and if no change in the output port #4 is detected, the second controller 538 determines that a system error has occurred and turns off the core voltage VDDC and restarts the IC for normal operation.

The core voltage VDDC, according to the output state of the output ports #3 and #4, may be set as in Table 2 below.

TABLE 2

| #3 | #4 | VDDC |
|---|---|---|
| L(0) | | Certain voltage (Vref) output |

TABLE 2-continued

| #3 | #4 | VDDC |
|---|---|---|
| H(1) | | output by #1 and #2 |
| | L(0) | abnormal internal state |
| | H(1) | Normal state (period output signal 'H') |

The restarted IC may drive a booting program based on information stored in the storage unit 669.

As described above, a power supply of an IC according to present embodiments may adaptively supply more efficient and optimum power, depending on characteristics of ICs employed in a TV system, to thereby stabilize a platform and reduce costs.

Also, optimum power is supplied to an IC according to characteristics of the IC in a platform, in which an additional module receiving the power is replaced or individual parts of the IC are changed.

Also, a power supply of an IC according to present embodiments identifies characteristics of the IC and adaptively supplies power to the IC to ease power specifications and increase yield in semiconductor processes.

Although a few exemplary embodiments have been shown and described, it will be appreciated by those skilled in the art that changes may be made in these exemplary embodiments without departing from the principles and spirit of the embodiments, the range of which is defined in the appended claims and their equivalents.

What is claimed is:

1. An integrated circuit (IC) comprising:
a power input unit, which receives power from an external power supply as a base power;
a core, which is driven by a power input through the power input unit; and
a controller that analyzes a phase locked loop (PLL) rising slew rate or a PLL falling slew rate which is measured while a substantially constant voltage is applied to the IC and determines a characteristic of the PLL rising slew rate or the PLL falling slew rate,
wherein the determined characteristic corresponds to a first characteristic if the PLL rising or the PLL falling slew rate is within a preset range, a second characteristic if the PLL rising or the PLL falling slew rate is lower than the preset range, or a third characteristic if the PLL rising or the PLL falling slew rate exceeds the preset range, and
wherein the controller reduces or increases the base power in response to the determined characteristic corresponding to the second characteristic or the third characteristic.

2. The IC according to claim 1, further comprising a PLL unit, wherein the controller analyzes a PLL of the PLL unit to determine the characteristics of the IC.

3. The IC according to claim 1, wherein the controller controls the external power supply to supply the power, which is lower than the base power, in response to the characteristics being determined to be the second characteristic.

4. The IC according to claim 3, wherein the power lower than the base power is within a specification range of the IC.

5. The IC according to claim 1, wherein the controller controls the external power supply to supply the power, which is higher than the base power, in response to the characteristics being determined to be the third characteristic.

6. The IC according to claim 5, wherein the power higher than the base power is within a specification range of the IC.

7. An electronic device which comprises the integrated circuit (IC) and the external power supply, the electronic device comprising:
the IC according to claim 1.

* * * * *